United States Patent [19]

Feth et al.

[11] 4,338,622
[45] Jul. 6, 1982

[54] SELF-ALIGNED SEMICONDUCTOR CIRCUITS AND PROCESS THEREFOR

[75] Inventors: George C. Feth; Tak H. Ning; Denny D. Tang, all of Yorktown Heights; Siegfried K. Wiedmann, Peekskill; Hwa N. Yu, Yorktown Heights, all of N.Y.

[73] Assignee: International Business Machines Corporation, Armonk, N.Y.

[21] Appl. No.: 53,473

[22] Filed: Jun. 29, 1979

[51] Int. Cl.³ .................... H01L 27/02; H01L 29/04
[52] U.S. Cl. ...................................... 357/92; 357/44; 357/59; 357/49
[58] Field of Search .................. 357/59, 92, 49, 44

[56] References Cited

U.S. PATENT DOCUMENTS

| | | | |
|---|---|---|---|
| 3,736,477 | 5/1973 | Berger et al. | 317/235 R |
| 3,904,450 | 9/1975 | Evans | 148/175 |
| 3,962,717 | 6/1976 | O'Brien | 357/44 |
| 3,982,266 | 9/1976 | Matzen | 357/44 |
| 3,993,513 | 11/1976 | O'Brien | 148/175 |
| 4,151,019 | 4/1979 | Tokumaru | 357/44 |
| 4,157,269 | 6/1979 | Ning et al. | 148/1.5 |
| 4,158,783 | 6/1979 | Berger | 357/44 X |
| 4,160,989 | 7/1979 | de Brebisson | 357/92 |
| 4,160,991 | 7/1979 | Anantha et al. | 357/59 X |
| 4,231,051 | 10/1980 | Custode | 357/59 X |
| 4,277,701 | 7/1981 | Hornung | 357/92 X |

FOREIGN PATENT DOCUMENTS 53-118985 10/1978 Japan .

OTHER PUBLICATIONS

Middelhoek et al., *IEEE Journ. of Solid State Circuits*, vol. SC-12, No. 2, Apr. 1977, pp. 135-138.
Ning et al, *IBM Tech. Discl. Bull.*, vol. 21, No. 2, Jul. 1978, pp. 846-849.
Dumke, *IBM Tech. Discl. Bull.*, vol. 21, No. 10, Mar. 1979.
Tang et al, *IEEE Trans. On Electron Devices*, vol. ED-27, No. 8, (Aug. 1980) pp. 1379-1384.
Berger et al, *IEEE Jour. of Solid State Circuits*, vol. SC-9, No. 5, Oct. 1974, pp. 211 et seq.
Weidmann, *IBM Tech. Discl. Bull.*, vol. 21, No. 1, Jun. 1978, p. 231.
Berger et al, *IEEE Journ. of Solid State Circuits*, vol. SC-14, No. 2, Apr. 1979, pp. 327 et seq.

*Primary Examiner*—Martin H. Edlow
*Attorney, Agent, or Firm*—Jackson E. Stanland

[57] ABSTRACT

A semiconductor circuit in which a plurality of transistors is provided, the collector regions/contacts and the base regions/contacts of the transistors being mutually self-aligned. In one embodiment, the collectors have conductive layer contacts (such as metal) and are self-aligned to polysilicon base contacts while in another embodiment the base contacts are comprised of a conductive (metal) layer while polysilicon is used for the collector contacts. The collectors of these transistors can be butted to a field oxide to reduce the extrinsic base area and to minimize excess charge storage in the base region. The base contacts, whether polysilicon or metal, etc. provide alternate base current paths so that the removal of the extrinsic base area does not adversely affect the total amount of base current which can flow. The use of a polysilicon layer for the base contacts, where "fingers" are provided by the polysilicon layer, enhances wirability and the mode of fabrication of the structure, since the polysilicon fingers can have an insulating layer (grown oxide) thereover to provide electrical isolation from over-lying conductors. These self-alignment techniques provide enhanced electrical properties since the distance between the base and collector contacts is minimized and since the base-emitter depletion layer capacitance, the stored charge and the base series resistance are reduced. From a processing standpoint, an additional masking step is not required to form the collector regions.

24 Claims, 41 Drawing Figures

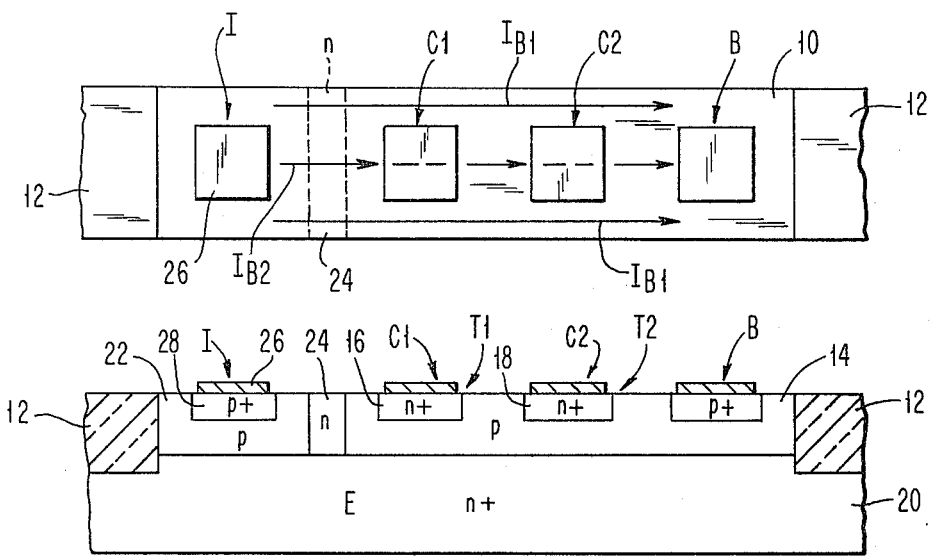
FIG. 1A
FIG. 1B
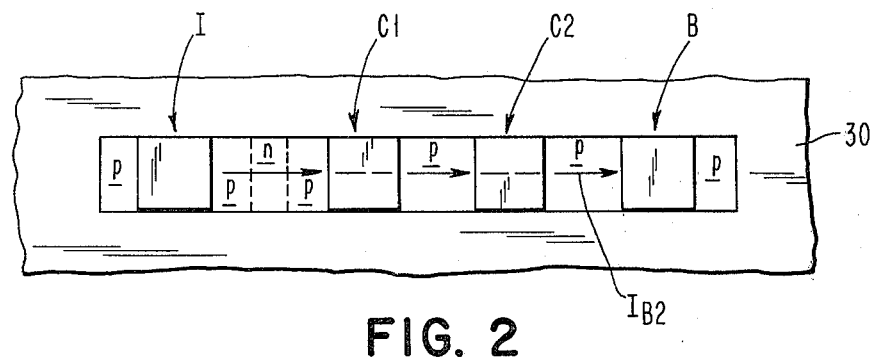
FIG. 2

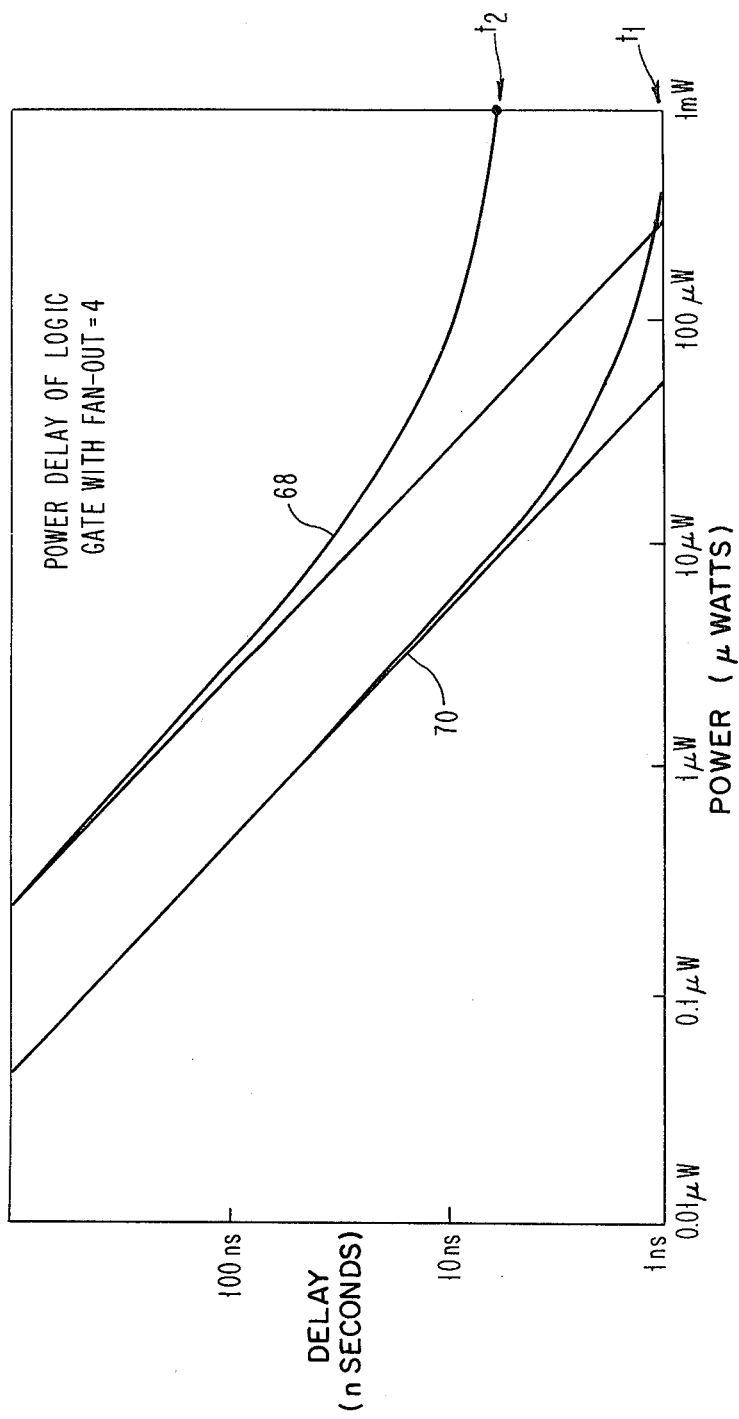

though the base contacts are self-aligned to the collector contacts.

SELF-ALIGNED SEMICONDUCTOR CIRCUITS AND PROCESS THEREFOR

TECHNICAL FIELD

This invention describes improved semiconductor circuits and processes for making the circuits, and in particular describes Merged Transistor Logic (MTL) circuits utilizing bipolar transistors, where the collector regions/contacts and the base regions/contacts are self-aligned.

BACKGROUND ART

In the fabrication of semiconductor circuits, the nature and type of the processing steps significantly affect the electrical circuit performance of the completed devices. This is particularly true when bipolar transistors are utilized in MTL ($I^2L$) circuits, where it is desirable to minimize the area of each region where minority carriers (i.e., electrons in a P type semiconductor region and holes in N type semiconductor regions) may be stored.

Generally, it is desirable to provide enhanced circuit performance by reducing the distance between the base and collector contacts of the transistors, and by reducing the base-emitter depletion layer capacitance, stored charge, and the base series resistance.

While it is generally known that these electrical characteristics should be enhanced to provide improved circuit performance, fabrication of a circuit to achieve these is not always simple, particularly if considerations must be taken of the design layout, density, and wirability of the circuit. Additionally, while techniques such as self-alignment are generally known for reducing the number of masking steps required, the provision of a process which achieves all of these desired characteristics has not heretofore been presented.

The circuit parameters to be considered in the design of MTL/$I^2L$ circuits have been identified and discussed in an article by Berger and Helwig which appeared in the IEEE Journal of Solid-State Circuits, Vol. SC-14, No. 2, April, 1979, at page 327. While those authors have pointed out the parameters which determine the speed limit of MTL circuits using bipolar transistors, a method for fabricating such a circuit and the circuit layout structure has have not been provided. They do, however, mention the use of oxide collars and the use of polysilicon as a low-ohmic bypass for the base current.

Another reference of interest is copending application Ser. No. 912,919, filed June 6, 1978, and assigned to the present assignee. In that copending application, a process is described for forming NPN transistors where the emitters are self-aligned to the polysilicon base contacts. However, the process steps and the resultant structure are distinct from the present process and structure.

In view of the importance of MTL structures using bipolar devices, it is a primary object of the present invention to provide MTL circuits in which the collector regions/contacts and the base regions/contacts are mutually self-aligned.

It is another object of the present invention to provide a process for fabricating such MTL circuits including the step of mutually self-aligning the collectors and the base contacts.

It is another object of the present invention to provide MTL circuits having improved performance, power-delay product and wirability.

It is another object of the present invention to provide improved MTL circuit structures having increased device density and wherein self-alignment is achieved.

It is another object of the present invention to provide MTL circuits in which the collectors are self-aligned to polycrystalline semiconductor base contacts, and wherein a polycrystalline semiconductor layer or a layer of metal can be used to contact the collectors.

It is another object of the present invention to provide MTL circuits in which the base contacts are self-aligned to polycrystalline semiconductor collector contacts, and wherein a layer of metal or a polycrystalline semiconductor layer can be used for the base contacts.

It is another object of the present invention to provide semiconductor circuitry including bipolar transistors in which mutual self-alignment of the collector and base contacts is utilized to reduce the distance between the base and collector contacts, and in which the base series resistance is minimized by the provision of alternate base current paths.

It is another object of the present invention to provide semiconductor circuitry using bipolar transistors, where the circuit fabrication provides increased density and improved electrical performance, while at the same time enhancing wirability of the circuits.

It is another object of the present invention to provide a technique for fabricating MTL circuits in which the collectors are self-aligned to the polycrystalline semiconductor base contacts, and wherein a polycrystalline semiconductor layer or a layer of metal or refractory metal-silicide can be used for the collector contacts.

It is another object of the present invention to provide a technique for fabricating MTL circuits in which the base contacts are self-aligned to the polycrystalline semiconductor collector contacts, and wherein a polycrystalline semiconductor layer or a layer of metal or refractory metal-silicide can be used for the base contacts.

DISCLOSURE OF THE INVENTION

This invention describes a process and a structure in which bipolar transistor circuitry is provided wherein the collectors and the base contacts are mutually self-aligned. In one embodiment, the base contacts are comprised of a layer of doped polycrystalline semiconductor while the collector contacts are metal or another layer of doped polycrystalline semiconductor or refractory metal-silicide, and in another embodiment the base contacts are comprised of a metal layer or a layer of doped polycrystalline semiconductor or refractory metal-silicide while the collector contacts are comprised of a doped polycrystalline semiconductor layer.

In this structure, the collector regions can be butted to a recessed field oxide to reduce the area of the base region and to reduce excess charge storage in the base region. In order to compensate for the resultant increased base resistance, the base regions are contacted by a continuous high conductivity layer on the top level of the structure which provides additional low resistance current paths for the base current.

Use of a polycrystalline layer for contacts to either the base or the collector regions allows enhanced wireability, since the doped polycrystalline semiconductor can be easily oxidized to provide electrical isolation for metallic interconnection lines deposited over this oxide layer.

The circuit properties of the self-aligned semiconductor structures described herein are enhanced, since the distance between the base and collector contacts is minimized due to the mutual self-alignment of the collectors and the base contacts. Since the base region is reduced, the base-emitter depletion layer capacitance and stored charge are reduced. The structure can be made quite small in order to increase the density of the circuit, and reduced power and improved performance result for the reasons mentioned above. While a doped polycrystalline semiconductor is used in the MTL circuits and structures of this invention, it is well known that refractory metal silicides, such as tungsten silicide, may be used on top of the usual doped polycrystalline semiconductor to reduce the resistance, and that the combined refractory metal silicide and doped polycrystaline semiconductor layers can be processed almost identically to the doped polycrystalline semiconductor layer alone. Therefore, it is implicit in the invention that the doped polycrystalline semiconductor layers can be replaced partly or completely with combined layers of polycrystalline semiconductor and refractory metal silicide which may result in additional circuit performance advantage and layout density.

While the general goals of increased density, enhanced wirability, and improved circuit performance are generally known in the art, no technique has been presented for simultaneously achieving all of these goals, and the resultant circuit structure has not been provided by the prior art.

These and other objects, features, and advantages of the invention will be apparent from the following more particular description of the preferred embodiments, as illustrated in the accompanying drawings.

BRIEF DESCRIPTION OF THE DRAWINGS

FIGS. 1A and 1B are schematic drawings of a conventional MTL structure where FIG. 1A is a top view and FIG. 1B is a cross sectional view. In these figures, there is no field recessed oxide abutting the collectors, and the paths followed by the base currents $I_{B1}$ and $I_{B2}$ are illustrated.

FIG. 2 is a top view of a conventional MTL structure in which the collectors are butted against a field recessed oxide in order to minimize the extrinsic base area. However, it also results in eliminating the base current paths $I_{B1}$.

FIG. 3A is a top view of the structure while FIG. 3B is a cross sectional view.

FIG. 4A is a top view of the structure showing the polysilicon mask having fingers to provide a path for the base current, while FIG. 4B is a cross sectional view of this structure. Layouts of the polysilicon mask other than the finger configuration can also be used.

FIG. 5 is a plot of the projected power delay of a logic gate having a fan-out of 4, where the delay is plotted along the vertical axis, and power is plotted along the horizontal axis. The top curve is for an MTL structure fabricated by present techniques, while the bottom curve is for a projected self-aligned structure fabricated in accordance with the principles of the present invention.

Figure 3A:
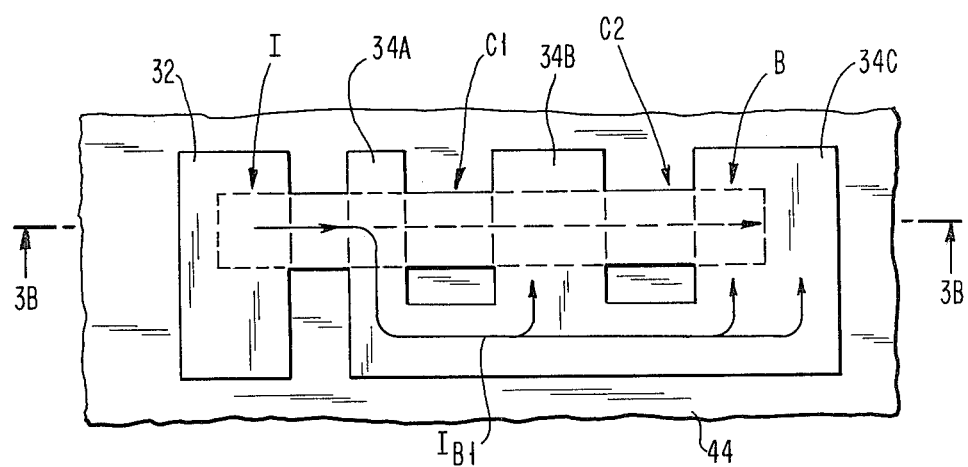
FIGS. 3A and 3B illustrate the use of a polysilicon mask to provide a current path for the extrinsic base current $I_{B1}$ in a structure having collectors butted against a field oxide. In particular.

In processes 6A-6L and 7A-7L, the base regions are contacted by polysilicon while the collectors are shown contacted by metal. However, polysilicon can also be used to contact the collectors.

FIGS. 8A-8I show a process for making a MTL structure in which the base contacts are self-aligned to the collectors. In contrast with the processes shown in FIGS. 6A-6L and 7A-7L, this process utilizes metal base contacts and polysilicon collector contacts. However, the metal contacting the base regions shown in FIGS. 8A-8I can also be replaced by polysilicon. In the processes of FIGS. 6A-6L and 7A-7L, polysilicon base contacts and metal collector contacts were used.

BEST MODE FOR CARRYING OUT THE INVENTION

In its broadest sense, this invention relates to a process for producing transistor structures in which the collectors are self-aligned to the base contacts, and transistor structures having base contacts self-aligned to the collectors. In one embodiment, poly-crystalline semiconductor collector contacts are used, while in another embodiment polycrystalline semiconductor base contacts are used. While it will be appreciated by those of skill in the art that semiconductor materials other than silicon can be used, the following description of the detailed process steps will be undertaken assuming that the semiconductor material is silicon. In this situation, a doped polycrystalline silicon (polysilicon) layer can be used to make contacts to the transistor regions, whether those are base regions or collector regions.

The provision of a structure in which the collectors and bases are mutually self-aligned provides improved performance of MTL circuits, improved power/performance, improved wirability, and improved density. For example, since self-alignment is used, an additional mask alignment is not required in the formation of the collector regions. Additionally, the distance between the base and collector contacts can be reduced and the extrinsic base area can be reduced. The extrinsic base area is generally used for making contact to the base region and for electrical isolation, and it is preferable to reduce this area which also reduces the charge storage area. This also reduces the base-emitter depletion layer capacitance.

Since silicon oxide can be grown easily over polysilicon layers, the active device regions need not be spread out to accomodate overlying metal wiring. Instead, an insulating oxide layer can be grown over the doped polysilicon layers and any metal interconnection lines can be formed over the silicon oxide. Still further, since polysilicon lines can be used instead of metal interconnection lines, and since polysilicon lines can be provided with a smaller pitch than can metal interconnection lines, improved density results.

MTL Structures (FIGS. 1A, 1B, 2, 3A, 3B, 4A, 4B and 5)

These figures illustrate merged transistor logic (MTL) structures, such as are described in more detail in U.S. Pat. No. 3,736,477, and in Berger and Wiedmann, IEEE J. of Sol. State Circuits, Vol. SC-7, No. 5, Oct. 1972 at page 340. MTL memory circuits are described in an IBM Technical Disclosure Bulletin by S. K. Wiedmann, Vol. 21, No. 1, June 1978, at pages 231 and 232.

In the practice of the present invention, these types of MTL structures are well known in the art, as are the circuits using these logic gates and storage cells. The present invention is directed to a technique for producing such structures having self-aligned collector and base contacts, and to the self-aligned structures. Therefore, the operation of the MTL circuits, such as those described in the aforementioned references will not be undertaken herein.

FIGS. 1A and 1B show a conventional MTL structure in which an injector I provides a base current $I_B = I_{B1} + I_{B2}$. Collector contacts C1 and C2 are shown, as well as the base contact B. The transistor comprising the injector I and the other transistors are provided in a surface of the semiconductor 10, which also has recessed oxide regions 12 therein. In this figure, and in the other figures to follow, it will be assumed that the semiconductor material 10 is a wafer of single crystal silicon. Therefore, the recessed oxide regions are comprised of silicon oxide.

In FIG. 1B, a cross-sectional view is shown which illustrates the injector I and the transistors T1 and T2. A base contact B is provided to the P type region 14 while collector contacts C1 and C2 are provided to N+ regions 16 and 18, respectively. A buried N+ region 20 in wafer 10 serves as a common buried emitter.

The injector is the emitter of a lateral PNP transistor, comprising the P type region 22, the N type region 24, and the P region 14. The injector contact 26 is made to a P+ region 28.

As is well known in the art, injector I provides base current to the transistors T1 and T2. This base current $I_B$ is comprised of a base current component $I_{B2}$ which travels through P type region 14 and another base current component $I_{B1}$ which is distributed via the extrinsic base region (i.e., the portion of P type region 14 surrounding the collector regions).

For performance and density considerations, it is desirable to minimize the extrinsic base area. One possibility is to butt the collectors against a field recessed oxide region, as shown in FIG. 2. This figure is a top view, similar to the top view of FIG. 1A, except that a silicon oxide region 30 is located on each side of the collector regions C1 and C2. However, this removes the current path for the extrinsic base current $I_{B1}$, so that only the intrinsic base current $I_{B2}$ can flow from the injector I to the base contact B.

The problem with the butted-collector structure of FIG. 2 is that it has a very high resistance for the base current $I_B$, since all of the base current must now flow through the intrinsic base region, which is usually of much higher resistance than the extrinsic base region.

In order to avoid the problem of high resistance for the base current in a structure using butted collectors as shown in FIG. 2, a polysilicon layer is used to provide a current carrying path for the extrinsic base current. Such a structure is illustrated in FIGS. 3A and 3B.

In FIG. 3A, a polysilicon layer 32 provides electrical contact to the injector I, while another polysilicon layer 34 provides electrical contact to the P type base region 36 (FIG. 3B) in order to provide a current path for the extrinsic base current $I_{B1}$. As can be seen from FIG. 3A, the polysilicon layer 34 has "fingers" 34A, 34B, and 34C. These fingers make contact to P+ regions 38A, 38B, and 38C, which are located in the top surface of P type region 36. A buried N+ emitter region 40 is also provided in the semiconductor wafer (FIG. 3B). This is a butted collector structure, so that recessed oxide regions 42 are provided at the left and right hand ends of FIG. 3B, and recessed oxide regions (FIG. 3A) are provided on each side of the collectors C1 and C2.

Figure 3B:
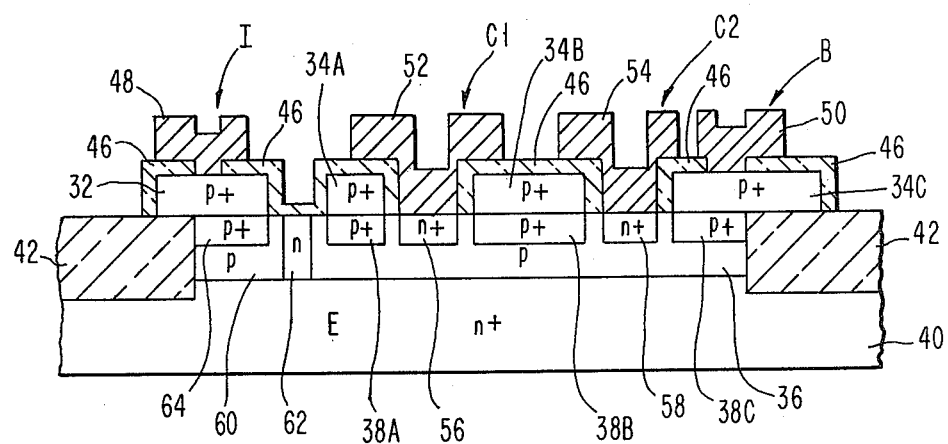

In FIG. 3B, a layer of silicon oxide 46 is provided over the polysilicon 32 and 34. Metal contacts 48 and 50 are provided to the injector I and the base B, while metal contacts 52 and 54 are provided to collectors C1 and C2, respectively. The collector regions are comprised of N+ regions 56 and 58. Thus, the MTL transistors are comprised of emitter region 40, base region 36, and collector regions 56 and 58, repectively. The injector is the emitter P type region 60 which is part of a lateral transistor comprising emitter 60, N type base region 62, and P type region 36. Electrical contact to P type region 60 is made via the P+ region 64.

In the structure of FIGS. 3A and 3B, base current can flow along the intrinsic base region but is primarily distributed via the polysilicon fingers 34A-34C.

Figure 4A:
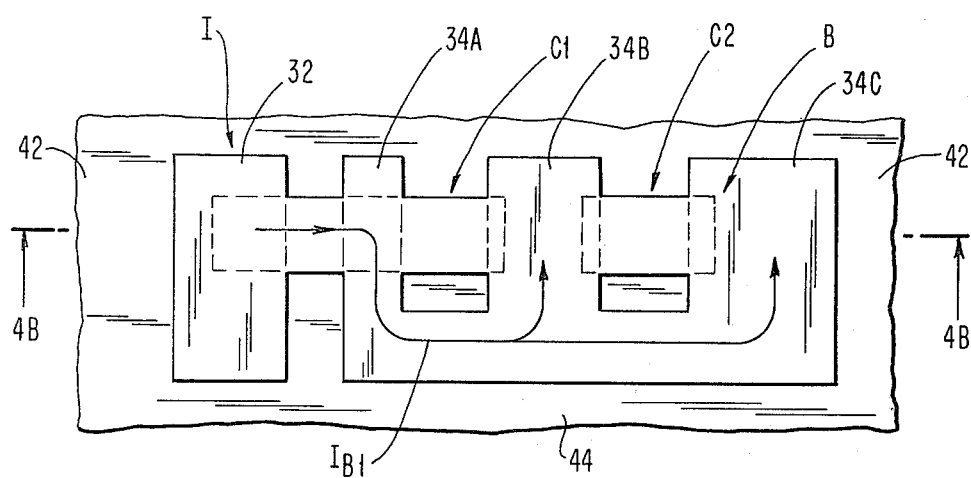
FIGS. 4A and 4B illustrate a MTL structure, similar to that of FIGS. 3A and 3B, except that recessed oxide regions are located between adjacent collectors in FIGS. 4A and 4B. As with FIGS. 3A and 3B, the collectors are butted against a field recessed oxide. In more detail.
Figure 4B:
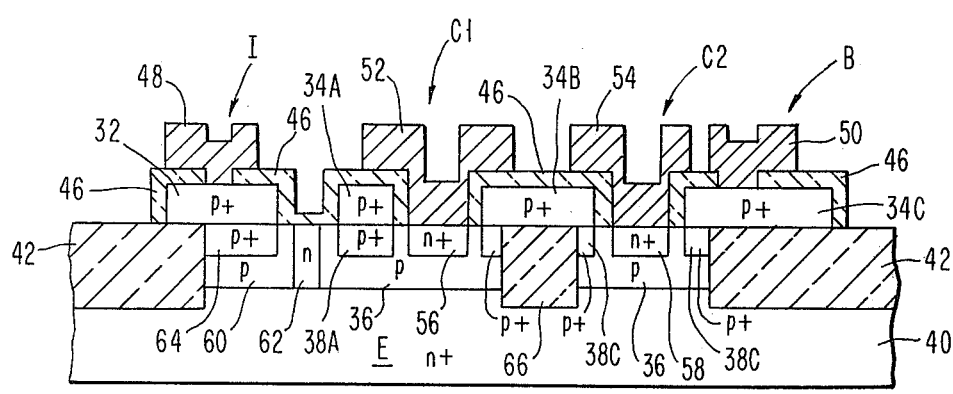

FIGS. 4A and 4B are very similar to FIGS. 3A and 3B, except that recessed oxide regions 66 are located between adjacent collectors, and therefore the base current is distributed only by the polysilicon fingers. Since the structures are otherwise identical, the same reference numerals will be used in FIGS. 4A and 4B as were used in FIGS. 3A and 3B.

As will be more apparent when the detailed process steps are described, the structures of FIGS. 3B and 4B are structures in which the collectors are self-aligned to the base contacts. Once the polysilicon layers 32 and 34 are provided, the oxide layer 46 grown thereover provides the mask through which the N+ collectors can be formed and to whichthe collector contacts 52 and 54 can be provided. In this technique, there is no need for an additional masking step to define either the collector regions or the collector contacts.

FIG. 5 illustrates the advantages of a self-aligned structure in comparison to present structures where the collectors are not self-aligned to the base contacts. The top curve 68 is the power delay curve of a logic gate having a fan-out of 4, which is produced by present techniques not involving self-alignment. The bottom curve 70 is the projected power delay curve for the same circuit in which the collectors are self-aligned to the base contacts. As is apparent from this figure, a self-aligned structure provides performance advantages, as well as layout advantages. The active device area can be reduced, which results in an improvement of the power-delay product.

In addition to the improvement in the power-delay prouduct, a significant improvement of the speed limit is obtained even when assuming the same vertical profile tolerances as in present fabrication processes. Due to the heavier doped extrinsic base in this structure with buried emitter/base junction, the storage time constant can be easily reduced. In addition, even with minimum dimensions, a more favorable emitter/collector area ratio is achieved, resulting in a further reduction of the emitter time constant. In FIG. 5, the speed limit $t_1$ is less for the proposed structure than the speed limit $t_2$ for the structure of the prior art.

A considerable improvement is also obtained by the much lower external-base sheet resistance provided by the present invention, as compared to the sheet resistance attainable in conventional MTL structures. High external base resistance may be a severe limitation for the speed limit, when operating devices at high currents. Of course, the power-performance of MTL gates made in accordance with the present processes can be significantly improved by using more advanced photolithographic tools and a shallower vertical profile, as can be projected for future bipolar transistor fabrication processes. The use of a refractory metal silicide, e.g. tungsten silicide, and polysilicon in combination in place of polysilicon alone, leads to further improvement in the performance of MTL circuits.

First Fabrication Process (FIGS. 6A-6L)

These figures illustrate one example of a self-alignment process for producing MTL structures in which the collectors are self-aligned to the base contacts. In this process, polysilicon base contacts will be provided and the lateral PNP transistor whose emitter forms the injector will be provided by masked ion implantation.

In the practice of the present invention, the techniques for making the lateral transistor comprising the injector are known in the art and do not form a significant part of the present invention. They are described here only for completeness and to show the compatibility of the PNP and NPN fabrication. The novelty of the present invention is the technique and structure resulting in self-alignment of the collectors to the base contacts in the inverter transistors of the MTL circuit gate.

Figure 6A:
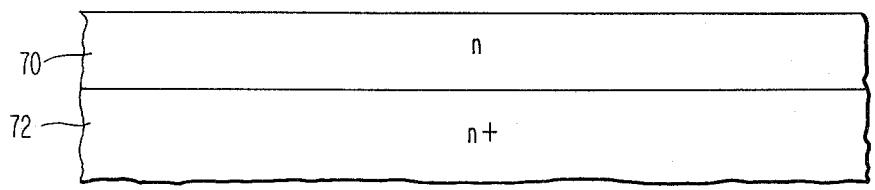
FIGS. 6A-6L illustrate the steps used in one process for making an MTL structure where the collectors are self-aligned to the base contacts. The collectors can be butted against the field recessed oxide, either with or without recessed oxide isolation between adjacent collectors. In the process of FIGS. 6A-6L, the lateral PNP injector transistor is formed by masked ion implantation.

Referring to FIG. 6A, it is assumed that the starting material is N type epitaxial silicon 70 formed on a N+ silicon substrate 72. Region 70 has a doping level of approximately $2 \times 10^{16}$ impurities/cm$^3$, and is about 6,000 Å thick.

Figure 6B:
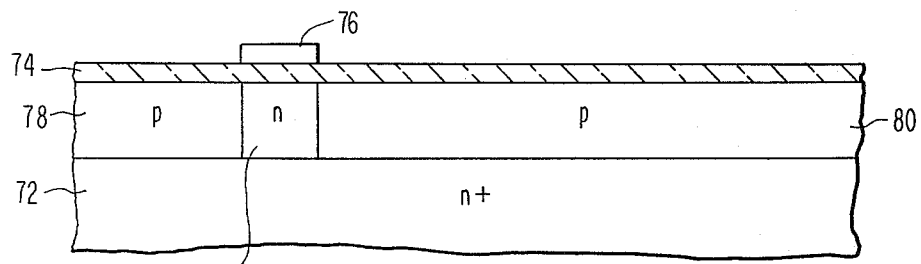

A layer of silicon oxide 74 is then formed over region 70. A tungsten layer 76 is then deposited over the entire structure. A photoresist layer is deposited and used as a mask to delineate the tungsten layer. Tungsten layer 76, shown in FIG. 6B, is used to protect the base region of the lateral PNP transistor. The other regions of layer 70 will be ion implanted with boron at about 200 KeV to make these regions P type. Thus, P type regions 78 and 80 are formed in layer 70, leaving N type region 82 beneath the tungsten mask 76. The doping of P type regions 78 and 80 is about $10^{17}$/cm$^3$.

Figure 6C:
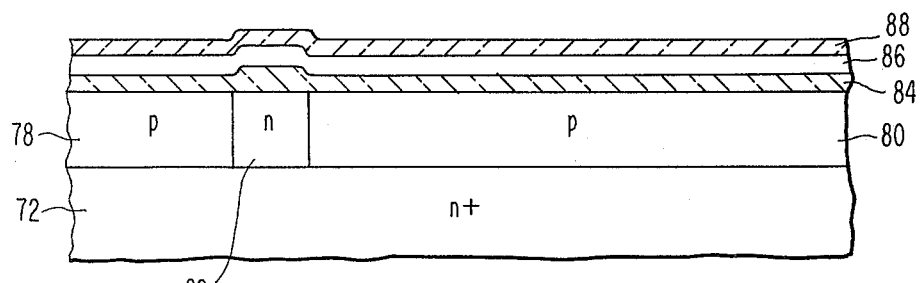

SiO$_2$ layer 74 is then etched around tungsten mask 76. Tungsten 76 is then removed, which will leave silicon oxide layer 74 only in the region above N type region 82. A layer 84 of SiO$_2$, a layer 86 of Si$_3$N$_4$, and a layer 88 of SiO$_2$ are then deposited as shown in FIG. 6C. These layers are used to provide the mask for formation of recessed oxide regions in the silicon single crystal.

Figure 6D:
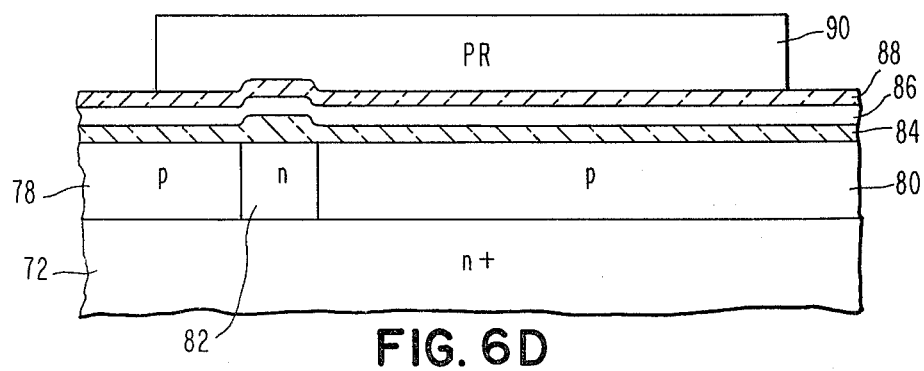
Figure 6E:
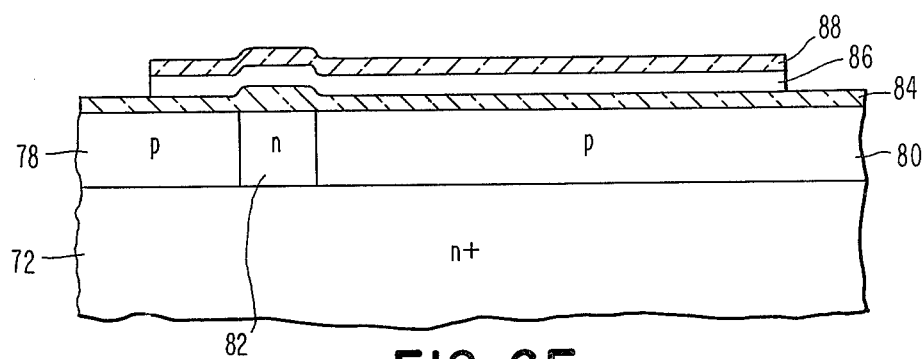

In FIG. 6D, a layer of resist 90 is used to protect the underlying layers except in those areas where the recessed oxide pattern is to be formed. Top layer 88 of silicon oxide is then etched where it is unprotected by resist 90. The resist layer is removed and silicon nitride layer 86 is then etched to remove those portions unprotected by silicon oxide layer 88. The resulting structure is shown in FIG. 6E.

Figure 6F:
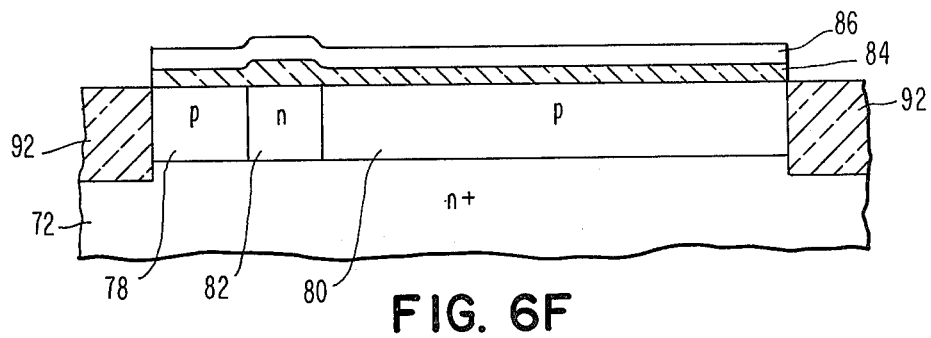

The portions of silicon oxide layer 84 no longer protected by silicon nitride layer 86 are then etched, and about 4,000 Å of the silicon regions not protected by the silicon nitride layer are etched. About 8,000 Å of recessed oxide 92 are then grown, as shown in FIG. 6F.

Figure 6G:
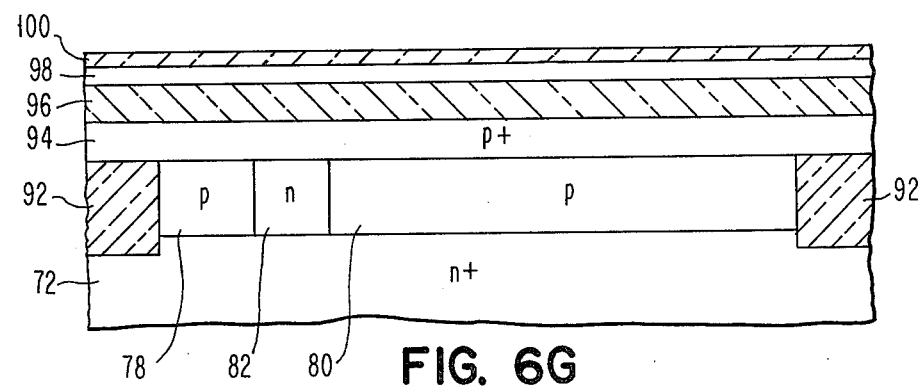

The remainder of this process details the production of self-aligned transistor structures to be used in MTL circuitry. In FIG. 6G, the silicon nitride mask 86 (FIG. 6F) has been removed and silicon oxide layer 84 has been etched. A layer 94 of boron doped P+ polysilicon is then deposited, over which is deposited a layer 96 of silicon oxide, a layer 98 of silicon nitride, and another layer 100 of silicon oxide. Layer 94 is approximately 4,000 Å thick, layer 96 is also approximately 4,000 Å thick, layer 98 is approximately 500 Å thick, and topmost silicon oxide layer 100 is also approximately 500 Å thick.

Figure 6H:
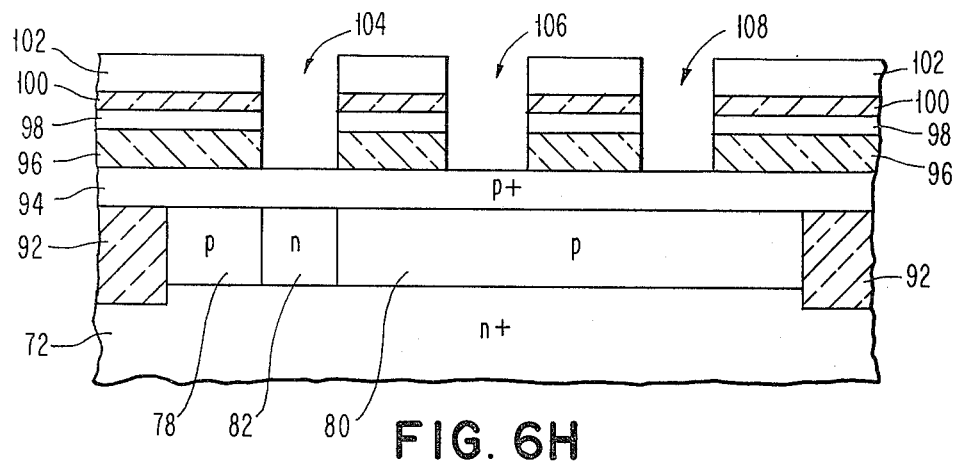

In FIG. 6H, a photoresist mask 102 has been used to delineate the collector regions and the polysilicon pattern which will later be formed as contacts to the base region. Using photoresist 102 as a mask, layers 96, 98, and 100 are reactively ion etched in a CF$_4$+H$_2$ mixture. This produces the windows 104, 106, and 108.

Figure 6I:
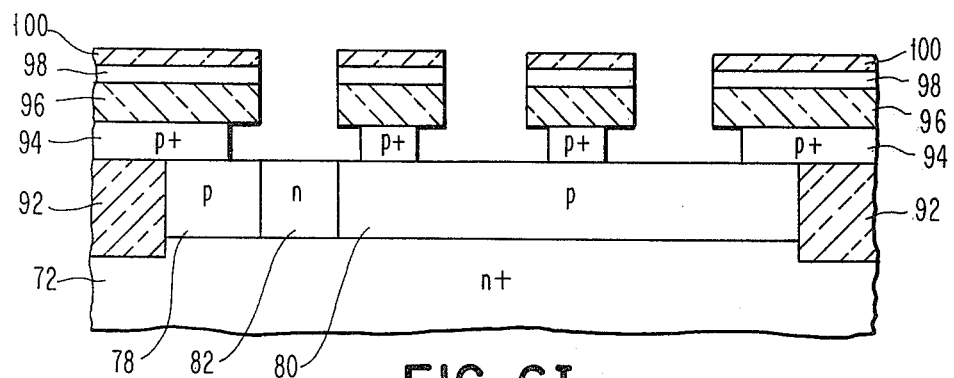

In FIG. 6I, photoresist mask 102 has been removed and the P+ polysilicon layer 94 has been preferentially etched in a mixture comprising HF:HNO$_3$:CH$_3$COOH = 1:3:8. Since the P+ polysilicon etches rapidly, overhanging layers 96-100 are produced.

Figure 6J:
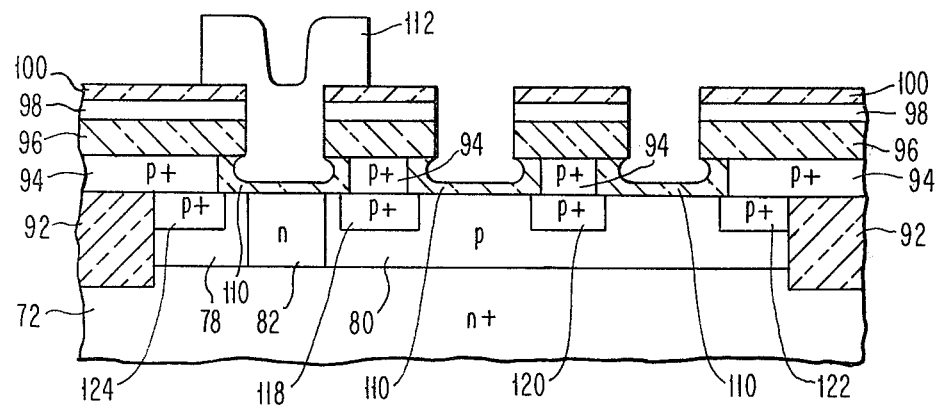

In FIG. 6J, a layer 110 of silicon oxide is grown on the exposed silicon and polysilicon surfaces to a thickness of approximately 2,000 Å. The P+ regions 118, 120, and 122, under the polysilicon fingers are produced when the dopant from the P+ polysilicon diffuses into the surface of P type region 80 during the oxide growth heat cycle. In a similar manner, P+ region 124 is formed in the top surface of the P type region 78. A photoresist layer 112 is then deposited and delineated over the region of N type conductivity 82. Resist 112 is used to mask the base region of the lateral PNP transistor.

Figure 6K:
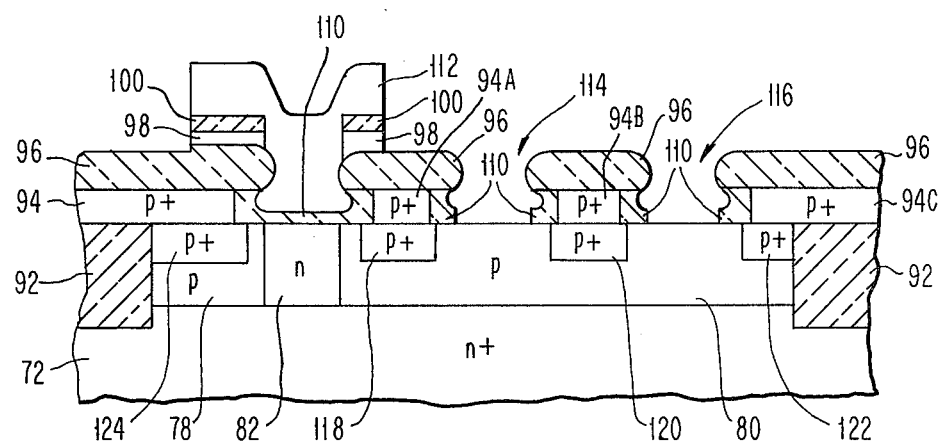

In FIG. 6K, reactive ion etching in a CF$_4$+H$_2$ gas mixture is used to remove silicon oxide layer 110 in the region not protected by the overhang regions 114 and 116 in order to open collector regions which will be formed in the top surface of P type layer 80. This etching step will etch the silicon oxide layer 100, the silicon nitride layer 98, and also the silicon oxide layer 96, partially. The overhang above the polysilicon layer 94 self-aligns the collector openings 114 and 116 to the base polysilicon contacts provided by the polysilicon fingers 94A, 94B, and 94C, which are portions of the polysilicon layer 94.

Figure 6L:
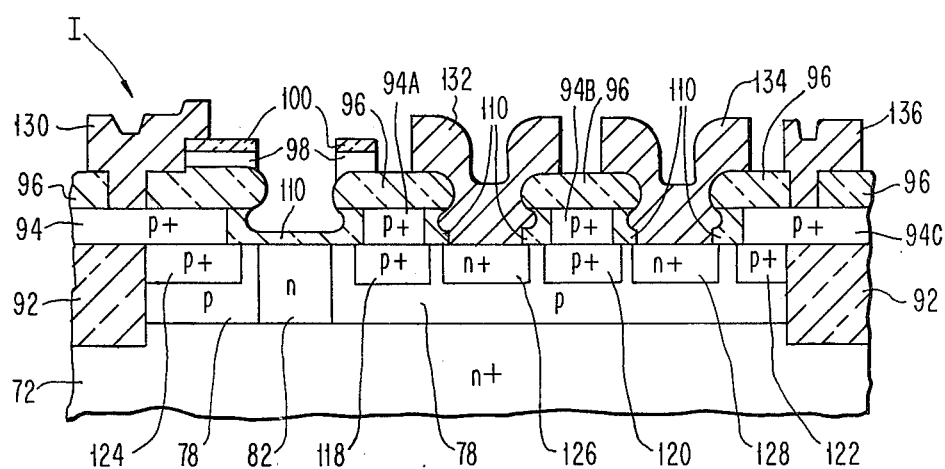

In FIG. 6L, the photoresist mask 112 is removed and N+ collector regions 126 and 128 are formed in the top surface of single crystal region 80, by either diffusion or ion implantation. These collector regions are self-aligned with the P+ polysilicon base contacts.

Photoresist is then used as a mask to define the contact openings to the polysilicon layer 94, in order to contact the injector and the base. This photoresist mask is used to provide openings through silicon oxide layer 96 into the injector and base regions. The photoresist mask is removed and the metal contact layer is deposited. This metal layer comprises a portion 130 which is in contact with the injector, portions 132 and 134 in contact with the collector N+ regions, and a portion 136 which contacts the base region.

Second Fabrication Process (FIGS. 7A–7L)

In the process to be described with respect to FIGS. 7A–7L, the starting material is a P type epitaxial silicon single crystal on an N+ type substrate, and the lateral PNP transistor will be formed by double diffusion.

Figure 7A:
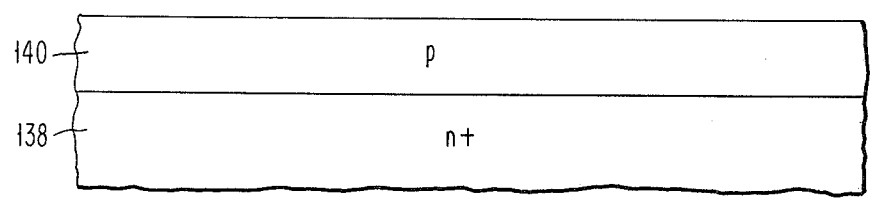
FIGS. 7A-7L show another process for making an MTL structure having collectors self-aligned to the base contacts. In this process, the lateral PNP injector transistor is made by double diffusion.

In more detail, FIG. 7A shows a single crystal semiconductor material 138, of N+ type, having a P type region 140 formed epitaxially on its top surface. Region 140 is approximately 5,000 Å thick and has a doping level of approximately $10^{15}$–$10^{16}$ impurities/cm$^3$.

Layers of silicon oxide, silicon nitride, silicon oxide are then formed in sequence on the surface of region 140. These layers will be used for recessed oxide masking. A photoresist layer is used to mask to delineate the recessed oxide pattern. After this, the silicon oxide top layer is etched where it is unprotected by the photoresist. The photoresist mask is then removed and the silicon nitride layer is etched. After this the exposed silicon oxide regions are etched, and then approximately 4,000 Å of silicon P type region 140 is etched. After this, approximately 8,000 Å of silicon oxide are grown in the recessed areas.

Figure 7B:
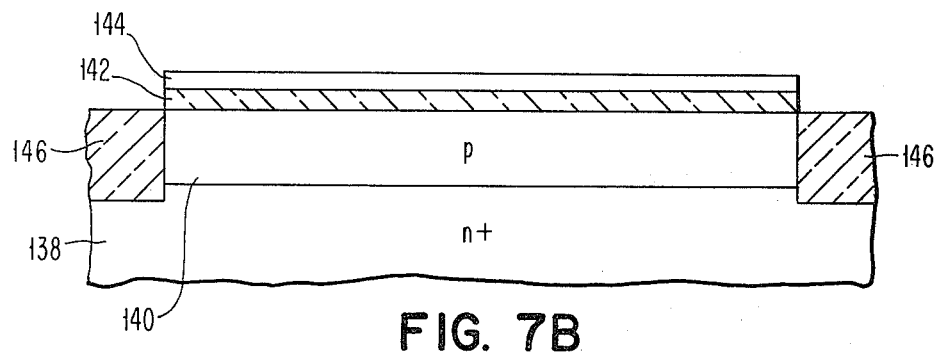
Figure 7C:
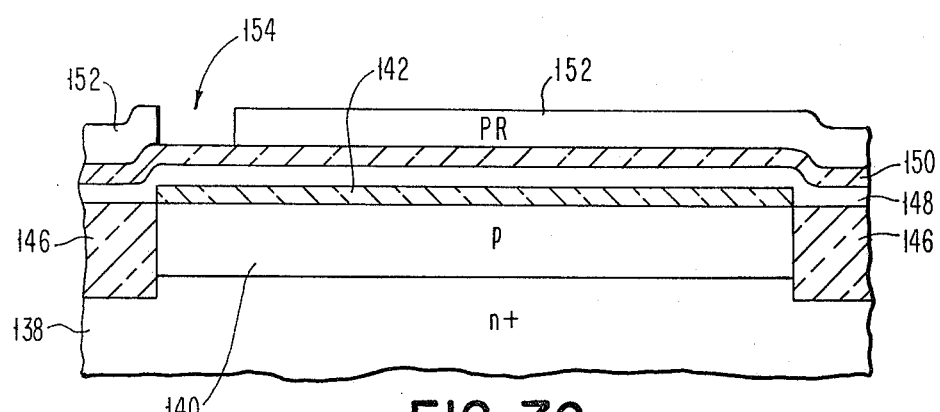
Figure 7D:
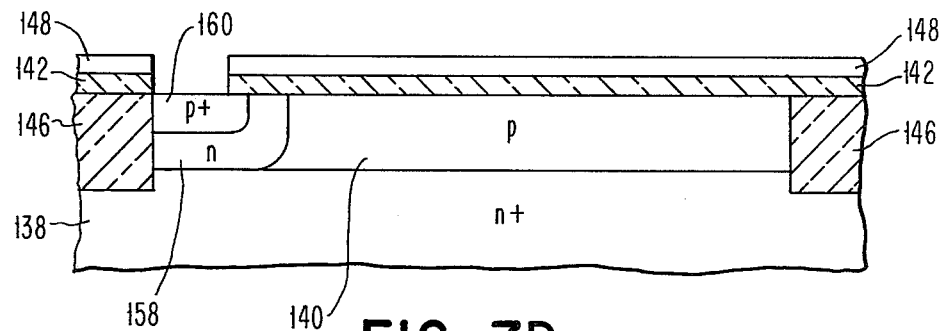

FIG. 7B shows the structure after these process steps have been done. The first layer 142 of silicon oxide (SiO$_2$) was formed on the top surface of region 140, and a layer 144 of silicon nitride (Si$_3$N$_4$) was formed over layer 142. After this, another layer of silicon oxide was formed over layer 144, but it is not shown in FIG. 7B since it was removed during the aforementioned process steps. These process steps were used to form recesses in silicon 140 so that the recessed oxide regions 146 could be formed therein.

Silicon nitride masking layer 144 is then removed, and new layers 148 of silicon nitride and 150 of silicon oxide are formed for diffusion masking purposes. A photoresist layer 152 (FIG. 7C) is then deposited for delineating the diffusion window 154.

SiO$_2$ layer 150 is then etched where it is exposed by the window 154. After this, the photoresist masking layer 152 is removed and silicon nitride layer 148 is then etched where it is unprotected by silicon oxide layer 150 (i.e., where it is exposed by the window 154. Aftr this, the underlying silicon dioxide layer 142–not protected by the Si$_3$N$_4$ layer 148–is etched. Phosphorus can then be diffused into P type region 140 to form the N type region 158 (FIG. 7D), after which boron is diffused to form the P+ region 160. This forms the lateral PNP transistor comprising regions 160, 158, and 140.

Figure 7E:
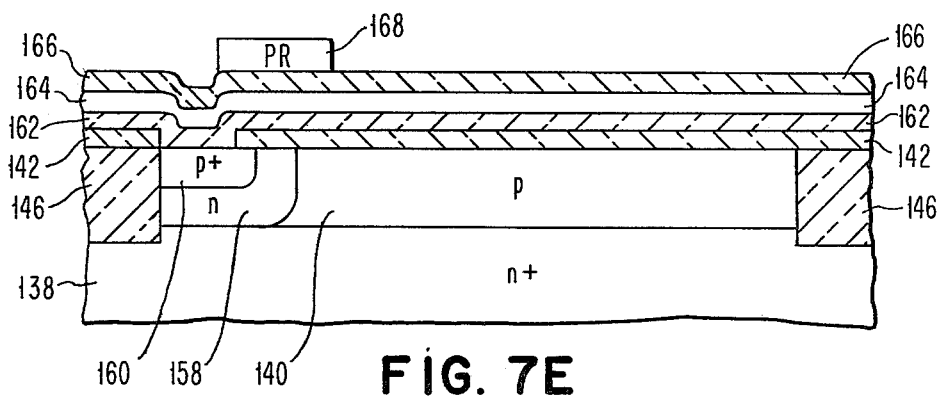
Figure 7F:
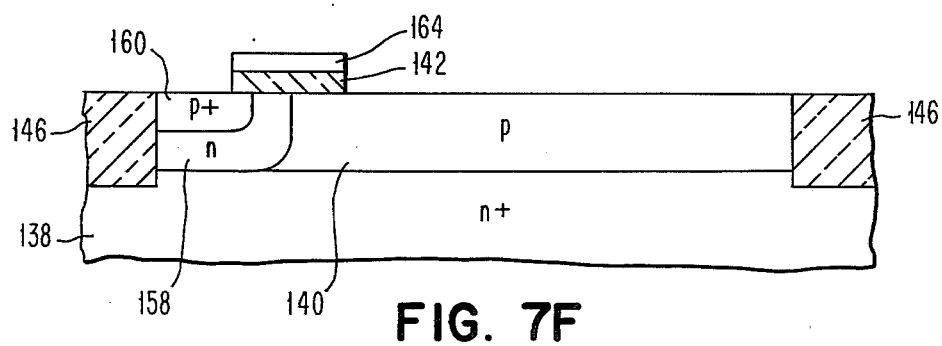

The silicon nitride masking layer 148 is then removed, and new layers 162 (SiO$_2$), 164 (Si$_3$N$_4$), and 166 (SiO$_2$) are then formed for masking the base regions of the lateral PNP transistor. A photoresist layer 168 is shown in FIG. 7E for delineating that mask.

After this, SiO$_2$ layer 166 is etched where it is not protected by resist layer 168, and then resist mask 168 is removed. This silicon nitride layer 164 is etched except in those locations where it is protected by silicon oxide layer 166. Then the SiO$_2$ layers are etched where they are unprotected by the remaining Si$_3$N$_4$ layer 164. This leaves the structure shown in FIG. 7F where a layer 142 of silicon oxide and a layer 164 of silicon nitride protect the base region 158 of the lateral PNP transistor. It should be noted that silicon oxide layer 142 has a thickness which includes the layer 162 shown in FIG. 7E.

Figure 7G:
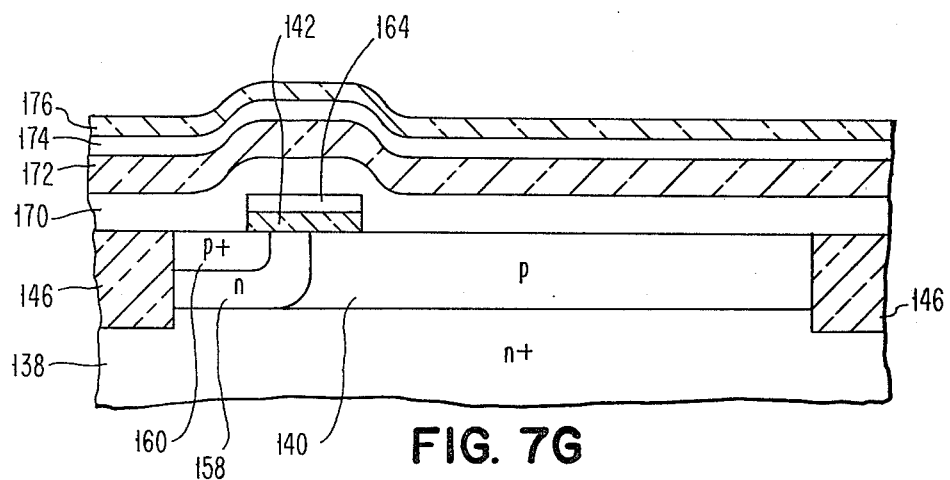

In FIG. 7G, a layer 170 of P+ type polysilicon is deposited to a thickness of approximately 4,000 Å. This polysilicon layer has been doped with boron to a level of approximately $10^{20}$ impurities/cm$^3$. After this, a layer 172 of SiO$_2$ is deposited to a thickness of about 4,000 Å, followed by a layer 174 of Si$_3$N$_4$, which is about 500 Å thick. A layer 176 of SiO$_2$ of about 500 Å is then deposited over silicon nitride layer 174. Layers 172–176 are used to delineate the collector regions of the vertical transistors.

Figure 7H:
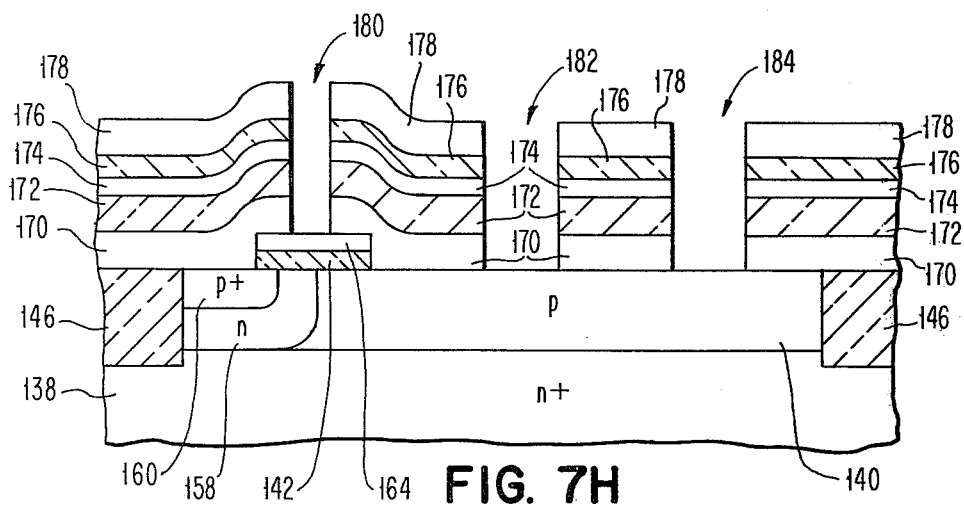

A photoresist masking layer 178 is then provided over the structure of FIG. 7H. Windows 180, 182, and 184 are provided in the photoresist layer. Layers 172, 174, and 176 are then reactively ion etched in a CF$_4$+H$_2$ mixture, using photoresist layer 178 as a mask. Etching occurs down to the polysilicon layer 170, as shown in FIG. 7H.

Figure 7I:
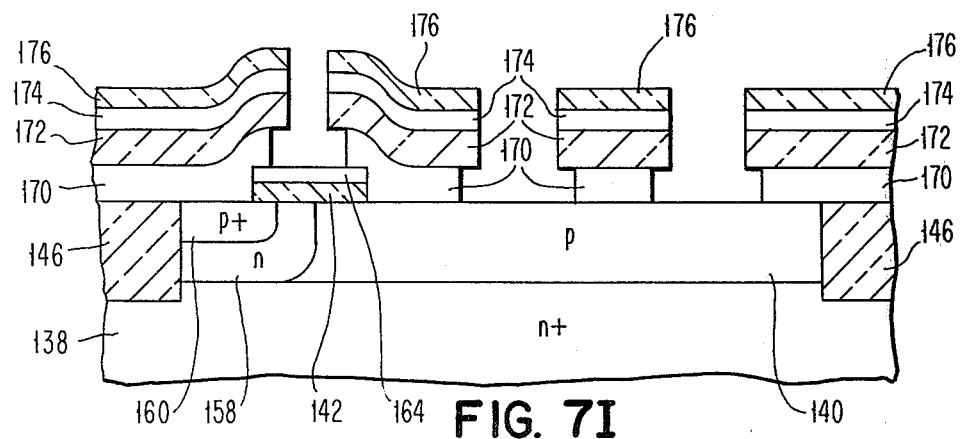

In FIG. 7I, the photoresist layer 178 has been removed and the P+ polysilicon layer 170 has been preferentially etched through the windows 180, 182, and 184. The etching solution is a mixture of HF:HNO$_3$:CH$_3$COOH in the ratio of 1:3:8.

Figure 7J:
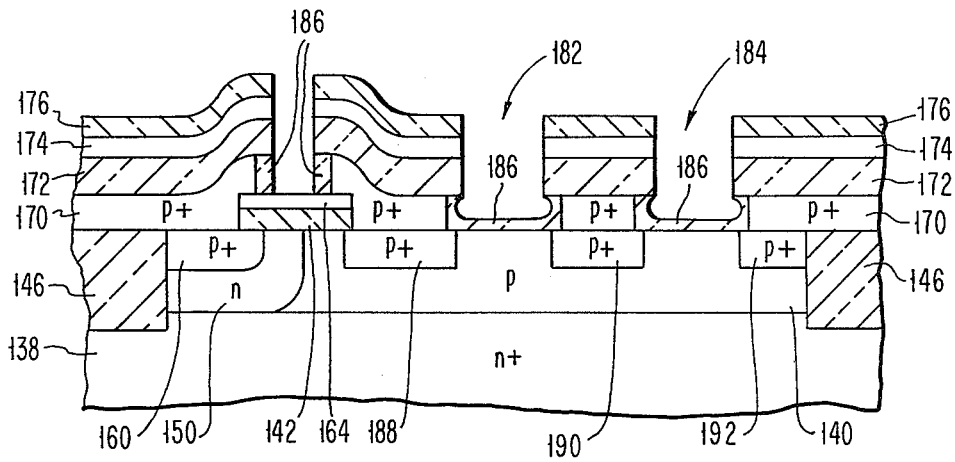
Figure 7K:
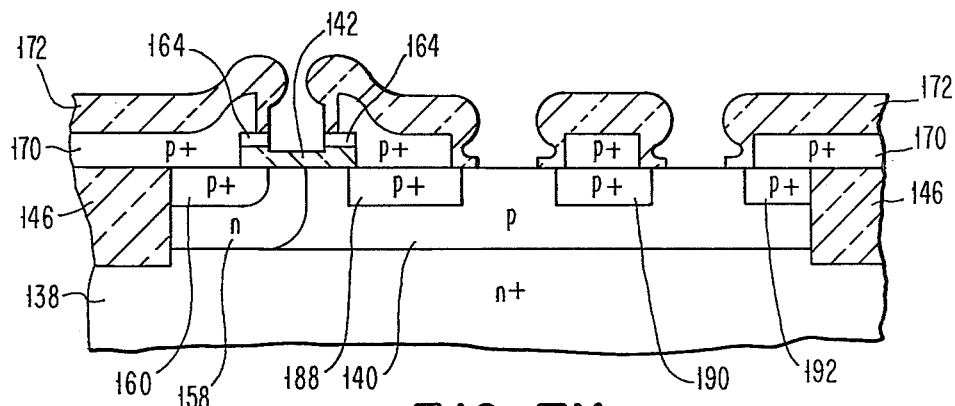

In FIG. 7J, a layer 186 of approximately 2,000 Å of SiO$_2$ is grown on the exposed single crystal silicon 140, as well as on the exposed polysilicon surfaces of layer 170. The P+ regions 188, 190, and 192 are formed by diffusion of boron dopant from the overlying P+ polysilicon layer 170 during the oxide growth heat cycle. Reactive ion etching in a mixture of CF$_4$+H$_2$ is then employed to remove the SiO$_2$ layer 186 in order to open the collector regions which will be formed in a top surface of P type region 140 (FIG. 7K). Specifically, they will be formed in the area of the windows 182 and 184. This reactive ion etching step is the same as the corresponding step in the previously described process (FIGS. 6A–6L), except that no masking step is required to protect the base region of the lateral PNP transistor. In this second process, the silicon oxide 142 and silicon nitride layer 164 are sufficiently thick that they provide a mask during the reactive ion etching step. The oxide layer 176 and the nitride layer 174 are also removed in this step.

Figure 7L:
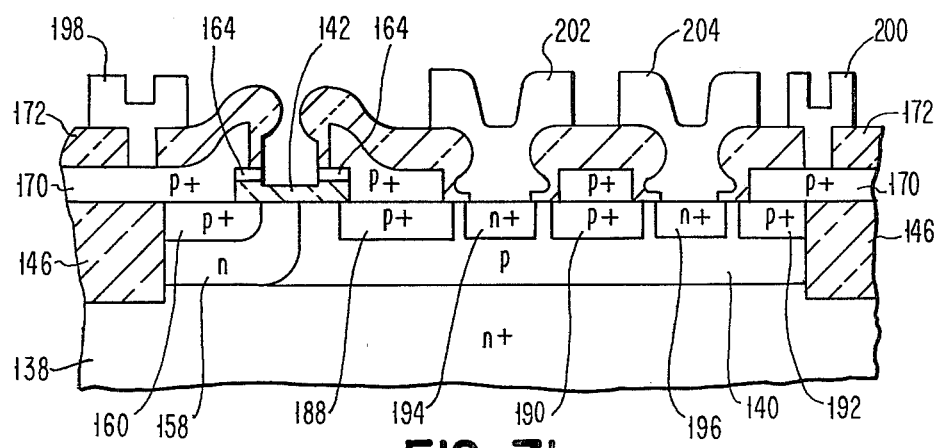

In FIG. 7L, the N+ collectors 194 and 196 are formed, using either diffusion or ion implantation. A photoresist layer is then used to delineate the contact vias to the polysilicon layer 170. SiO$_2$ layer 172 is then etched through this resist mask to provide openings for formation of electrical contact 198 to the injector and contact 200 to the base. Collector contacts 202 and 204 are formed at the same time as the injector and base contacts 198 and 200, respectively. These contacts 198–204 can be formed of metal, polysilicon, etc.

Thus, another fabrication process has been described wherein the collectors and bases are mutually self-aligned and wherein the P+ polysilicon fingers form a current path for the injected current into the base region. In FIG. 7L (and also in FIG. 6L), the use of recessed oxide isolation between the collector regions is not illustrated, but can be provided in the step during which the other recessed oxide portions are provided.

Third Fabrication Process (FIGS. 8A–8I)

These figures show another process for providing structures in which the collectors are self-aligned to the base contacts. In contrast with the structures shown previously, the base contacts in this process are metal, while the collector contacts are formed from a polysilicon layer. Self-alignment is achieved using the fact that N+ silicon oxides 4-5 times faster than lighter doped silicon in steam at low temperatures (for instance, temperatures of about 800° C.). This technique allows the base contacts to be placed very close (less than 4,000 Å) to the collector contacts. Furthermore, since it allows metal contact to all of the extrinsic base regions, external base resistance is automatically minimized. As with the other processes, the collector regions can be butted against the recessed oxide isolation, and isolation can be provided between adjacent collectors using recessed oxide regions.

In this process, the lateral PNP transistor is formed by double diffusion, although it should be understood that any other type of technique can be used.

In this process, and in the others heretofore described, the base metal crosses over the polysilicon collector contacts and therefore increases the collector-base capacitance somewhat. However, this increase in collector-base capacitance is relatively small.

Figure 8A:
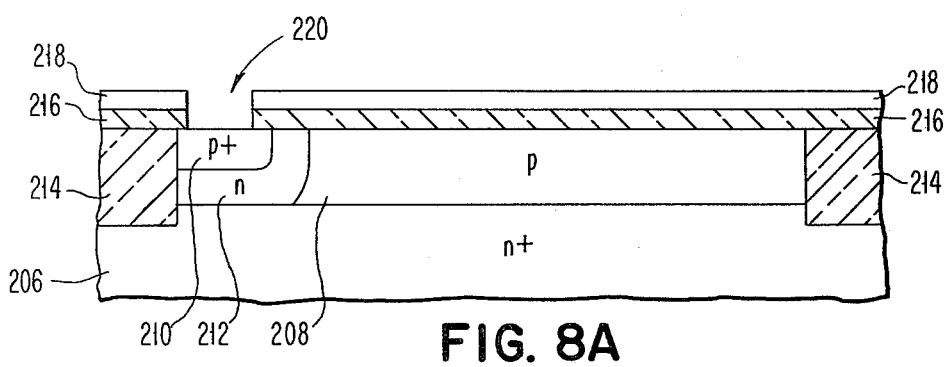

FIG. 8A shows the structure where the lateral PNP transistor has already been formed. A double diffusion process, similar to that shown in FIG. 7A–7C, has been used to provide this structure. Rather than repeating the figures used previously, the self-alignment technique of the present invention will be described starting from a point where the lateral PNP transistor has already been fabricated. In FIG. 8A, a semiconductor body 206, having N+ doping, has thereon a P type region 208. A P+ region 210 and an N type region 212 complete the lateral PNP transistor. Recessed oxide regions 214 are provided in the single crystal semiconductor comprising regions 206 and 208.

A layer 216 of $SiO_2$ and a layer 218 of $Si_3N_4$ are provided on the top surface of the semiconductor device. A window 220 has been formed to expose a portion of the top surface of region 210.

Figure 8B:
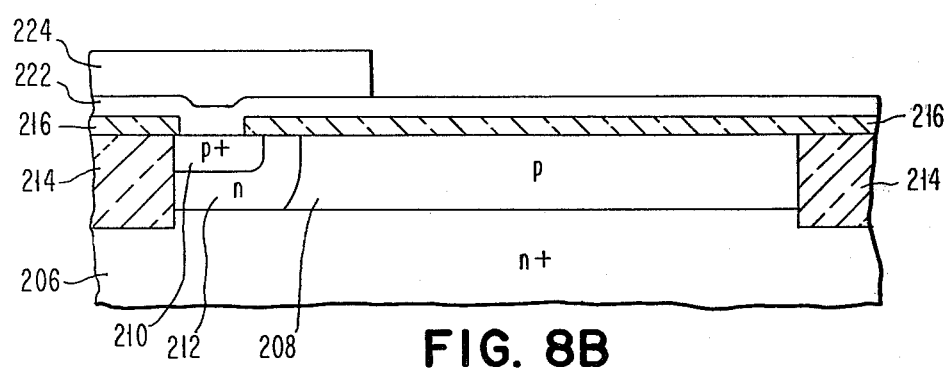

In FIG. 8B, the $Si_3N_4$ mask 218 has been removed, and another $SiO_2$ layer 222 has been formed over the previous $SiO_2$ layer 216 and over the exposed portion of P type region 210. After this, a layer of resist mask 224 has been applied for delineation of layer 222 in order to mask the emitter and base regions of the lateral PNP transistor. The $SiO_2$ in layers 216 and 222 is then etched in order to remove all $SiO_2$ except in those areas protected by resist 224. Photoresist mask 224 is then removed to leave the structure of FIG. 8C. In this figure, silicon oxide layer 226 is what is left of layers 216 and 222.

Figure 8C:
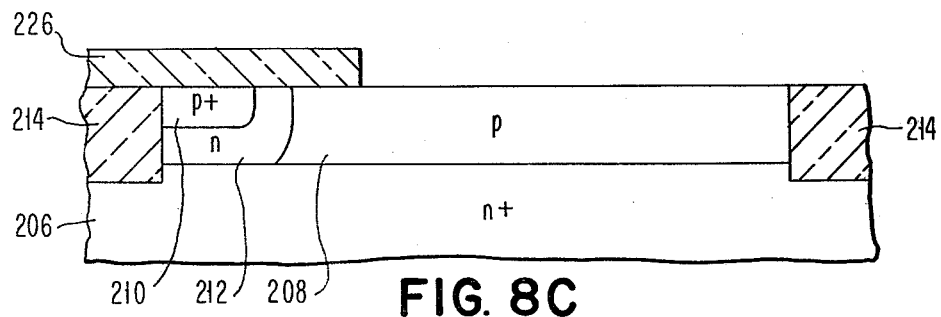
Figure 8D:
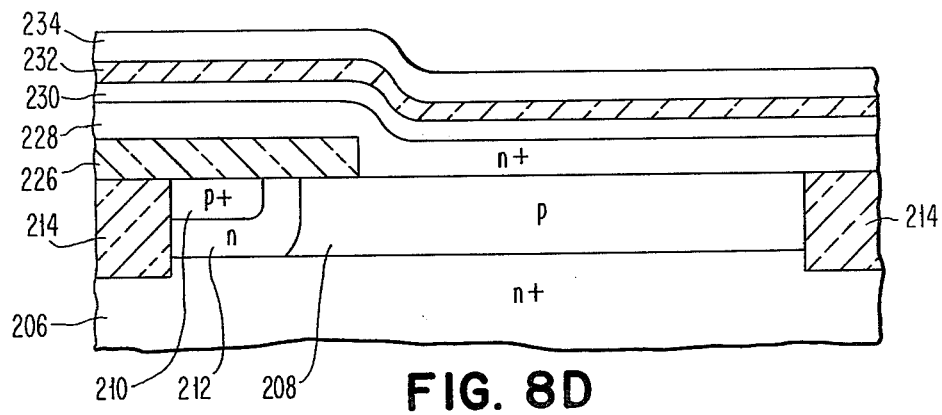
Figure 8E:
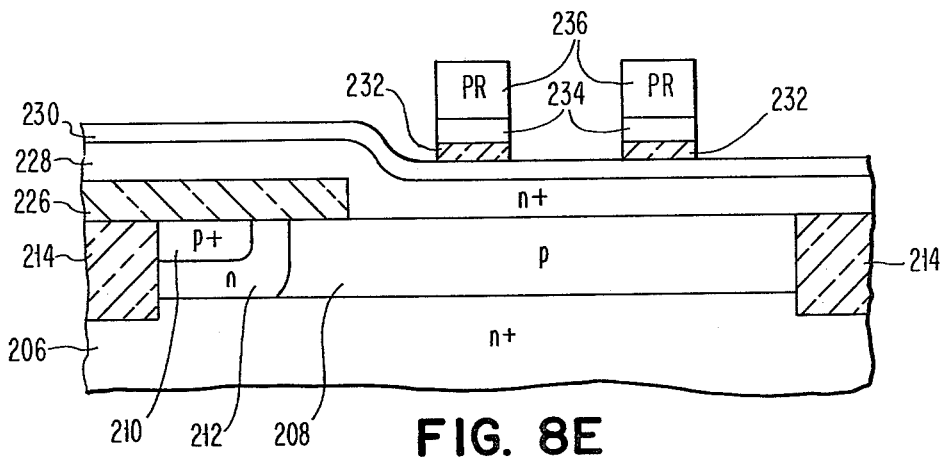
Figure 8F:
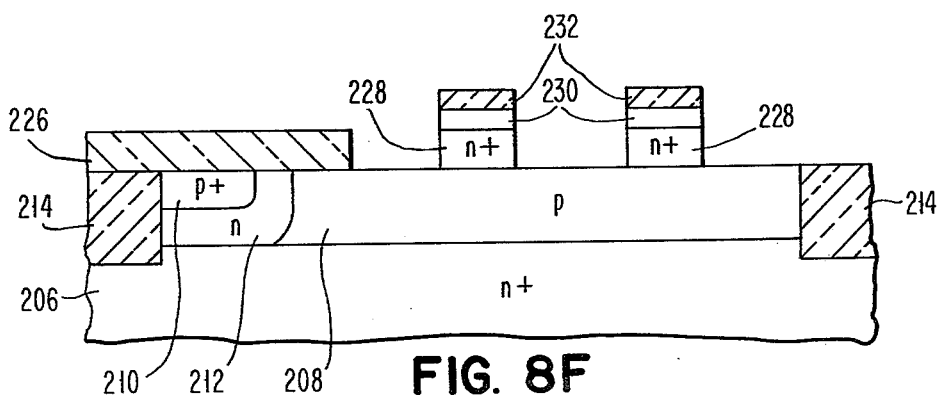

In FIG. 8D, a layer 228 of arsenic doped polysilicon is deposited over the entire structure of FIG. 8C. After this, a layer 230 of a refractory metal silicide, such as tantalum silicide or tungsten silicide, is deposited to enhance the conductivity of polysilicon layer 228. A layer 232 of $SiO_2$ is then deposited, followed by a layer 234 of a metal, such as aluminum.

A photoresist layer 236 (FIG. 8E) is then used to delineate the polysilicon pattern to be formed in layer 228. Aluminum layer 234 and $SiO_2$ layer 232 are then etched in regions unprotected by photoresist 236 in order to produce the structure of FIG. 8E.

The photoresist mask 236 is then removed and the remaining aluminum layer 234 is used as a mask in order to reactively ion etch the silicide layer 230 and half way through the polysilicon layer 228. Reactive ion etching occurs in a $CF_4$ gas. The aluminum mask is then removed and final etching of the N+ polysilicon layer 228 occurs. The finish etching is in a mixture of $HF:HNO_3:CH_3COOH = 1:3:8$. This mixture preferentially etches the heavily dopedsilicon to leave the structure shown in FIG. 8F.

Figure 8G:
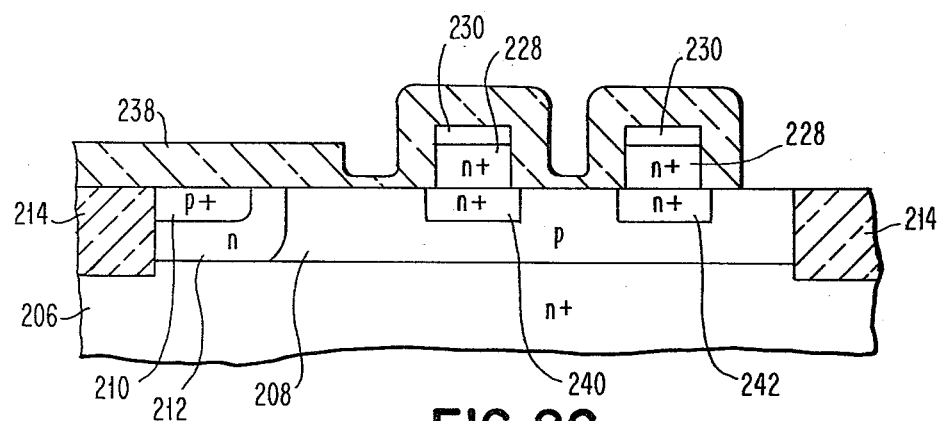
Figure 8H:
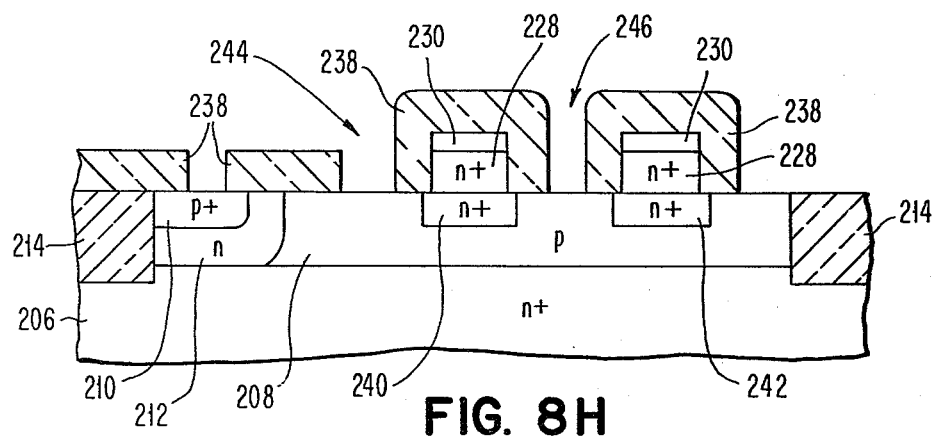

In FIG. 8G, a layer of $SiO_2$ is grown on all exposed silicon surfaces by steam oxidation at low temperatures, for instance 800° C. At such low temperatures, the N+ polysilicon layer 228 oxides 4-5 times faster than the P type silicon substrate 208. This produces the layer 238 of $SiO_2$ of varying thickness. N+ collector regions 240 and 242 are produced when the dopant from polysilicon layer 228 diffuses into the top surface of P type region 208, during the steam oxidation step.

A photoresist layer (not shown) is then used to delineate the contact hole openings to the P+ region 210 and to the collector N+ polysilicon regions. It is assumed that contacts to the N+ polysilicon regions are made over the recessed field oxide layer 214, hence they are not shown in FIG. 8H. After this, the photoresist mask is removed. The entire structure is then dip-etched to remove the $SiO_2$ over the P type substrate, which opens the P type base region 208 for subsequent metal contact. The openings 244, 246, and 248 made by this dip-etch easily occur, since the thickness of the silicon dioxide layer 238 in these regions is thinner than elsewhere.

Figure 8I:
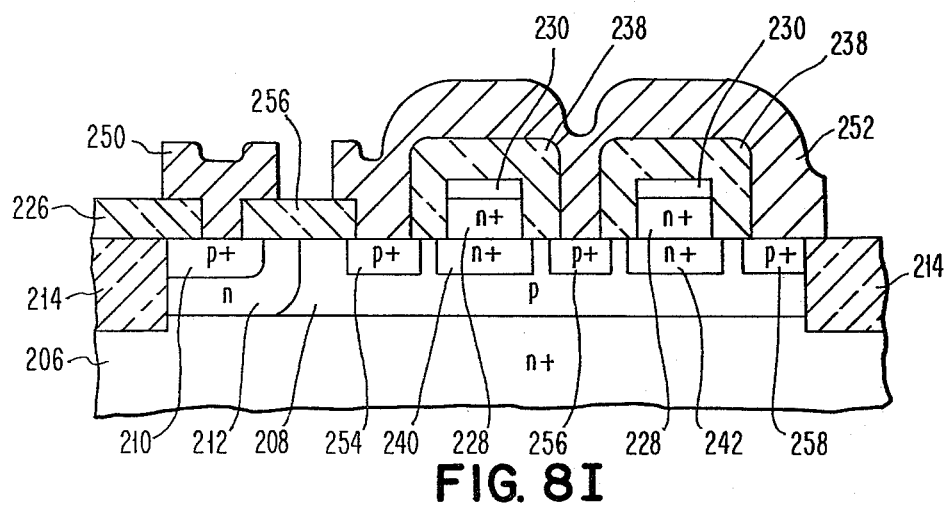

In FIG. 8I, the surface doping concentration of the P type extrinsic base region 208 is increased by either diffusion or ion implantation to ensure good metal contact. A metal layer is then deposited and delineated through a resist mask to provide a metal contact 250 to the P+ region 210, and a metal base contact 252 to the P+ regions 254, 256, and 258 having increased doping concentration. Metal contacts to the polysilicon are over the thick field oxide and hence are not shown in this figure.

Thus, a structure has been produced having polysilicon collector contacts, where the collector contacts and base contacts are mutually self-aligned. The base contacts can be comprised of the layer 252, which can be any conductive material, such as metal, doped polysilicon, polysilicon/silicide sandwich, or a silicide layer.

In the practice of this invention, semiconductor materials other than silicon can be used, including Ge and GaAs. Additionally, the collectors need not be butted against the recessed oxide, although such is preferable. Recessed oxide need not be used between adjacent collectors, but sufficient injection currents will be provided even if these recessed oxide portions are used.

This concept of self-alignment assists in making the extrinsic base area as small as possible, and also allows for the collectors and base regions to be placed closely together. The MTL transistors need not be vertical, and any conductivity type substrate can be used as as starting material. Still further, the self-alignment techniques of the present invention can be used to make any type of semiconductor circuitry since the number of metal lines per level of fabrication is reduced by the use of polysilicon contacts and by the alignment technique described herein.

In accordance with the principles of this invention, a doped polysilicon layer is used to make electrical contacts to regions of the transistors forming the semiconductor circuit. The polysilicon lines are then oxidized to provide electrical insulation between these lines and other lines which will be used for providing electrical contact to other regions of the circuit transistors. This other level can be comprised of any conductive material, such as a metal or another polysilicon layer. In the present technique, a dopant from the polysilicon layer diffuses into a top surface of the semiconductor substrate to form regions therein to which the polysilicon layer makes electrical contact. Further, by vertically etching the (oxide) insulation layer formed on the polysilicon, certain regions in the surface of the semiconductor substrate will be exposed for inclusion of a dopant therein to form opposite conductivity type regions than those formed by diffusion of the dopant from the polysilicon into the semiconductor substrate. The second level of contact material can then be provided through the openings in the oxide insulation layer and the polysilicon layer. This automatically aligns the opposite conductivity regions of the transistor which are to be contacted by the overlying levels of electrical connection materials. Of course, polysilicon contacts can be made to the base or collector regions, or even to both of these regions.

In this region, use can be made of the fact that highly doped polysilicon oxidizes rapidly at low temperatures, and more so than more lightly doped silicon. This process step can be extremely well controlled in order to define the polysilicon-mask which will be used in the formation of opposite conductivity type regions in the semiconductor substrate. Further, the reactive ion etching step provides a vertical etching profile in which an overhang can be created, if necessary. These fabrication steps allow a semiconductor circuit to be produced in which the extrinsic base area can be reduced by the use of a recessed field oxide, without adversely affecting the base currents, since the "fingers" provide alternate current paths, and the collector and base contacts can be moved very close together in order to increase circuit density and decrease stored charge. Because the polysilicon layer can be easily oxidized to provide an electrically insulating layer, enhanced wirability results, in addition to the use of these patterned layers as a self-alignment mask.

Self-alignment can be achieved even if the overhang is not present. The amount of overhang and the oxide layer thickness in the overhang regions determines the spacing between the collector and base contacts. Generally, it is not desirable to have highly doped N and P type regions too close together, especially if high voltage is to be used. Thus, larger overhangs and thicker oxides are used when it is desired to have large breakdown voltages.

While in the processes shown in FIGS. 6A–6L and 7A–7I, the collector regions are shown doped heavily to form ohmic contacts with the overlying conductive layer, it will be understood by those skilled in the art that the N type collector region doping level can be reduced in order to form rectifying contacts (i.e., Schottky diode contacts) with an overlying metal or metal silicide layer. Such Schottky-collector MTL circuits may further improve the circuit characteristics.

While the invention has been particularly shown and described with reference to preferred embodiments thereof, it will be understood by those skilled in the art that the foregoing and other changes in form and details may be made therein without departing from the spirit and scope of the invention.

Having thus described my invention, what I claim as new, and desire to secure by Letters Patent is:

1. A MTL circuit comprising, in combination:
an injector transistor located in a single crystal semiconductor layer, having collector, base and emitter regions,
at least one logic fan-out transistor located in said semiconductor layer, having collector, base and emitter regions with electrical contacts thereto, wherein the collector region of said injector transistor is electrically connected to the base region of said fan-out transistor and wherein the collector region and its contact of said fan-out transistor are mutually self-aligned with the base region and the contact thereto of said fan-out transistor,
recessed electrical isolation regions in said semiconductor layer abutting said collector region of said fan-out transistor,
a polycrystalline semiconductor layer making electrical contact to the collector regions of said at least one fan-out transistor and located over said single crystal semiconductor layer,
a metal layer located over said polycrystalline semiconductor layer and insulated therefrom for making electrical contact to said base region of said at least one fan-out transistor.

2. The circuit of claim 1, further including insulating regions buried in said single crystal semiconductor layer and located between adjacent collector regions therein.

3. The circuit of claim 1, including a plurality of fan-out transistors having a common base layer in said single crystal semiconductor, said common base layer being electrically contacted at a plurality of locations by said metal layer.

4. The circuit of claim 3, further including insulating regions located in said single crystal semiconductor layer between collector regions of said fan-out transistors.

5. The circuit of claim 1, where said injector transistor is a pnp transistor and said at least one fan-out transistor is a npn transistor.

6. The circuit of claim 1, where said injector transistor is a lateral transistor and said at least one fan-out transistor is a vertical transistor.

7. The circuit of claim 1, further including an electrically insulating layer located between said polycrystalline semiconductor layer and said metal layer.

8. The circuit of claim 1, where said polycrystalline semiconductor layer is doped to provide electrical conductivity thereof, and said single crystal semiconductor layer has regions therein containing a dopant which has diffused into said single crystal semiconductor layer from said polycrystalline layer.

9. The circuit of claim 1, where said fan-out transistor is a bipolar transistor.

10. The circuit of claim 1, where said single crystal semiconductor layer is selected from the group consisting essentially of Si, Ge and GaAs.

11. The circuit of claim 1, where said single crystal semiconductor layer is silicon and said polycrystalline semiconductor layer is a layer of doped polysilicon.

12. A MTL circuit comprising, in combination:
an injector transistor located in a single crystal semiconductor layer, having collector, base and emitter regions,
at least one logic fan-out transistor located in said semiconductor layer, having collector, base and emitter regions with electrical contacts thereto, wherein the collector region of said injector transistor is electrically connected to the base region of said fan-out transistor and wherein the collector region and its contact of said fan-out transistor are mutually self-aligned with the base region and the contact thereto of said fan-out transistor, recessed electrical isolation regions in said semiconductor layer abutting said collector region of said fan-out transistor, a polycrystalline semiconductor layer located over said single crystal semiconductor layer for making electrical contact to said base region of said at least one fan-out transistor, a conductive layer located over said polycrystalline layer and insulated therefrom for making electrical contact to said collector regions of said at least one fan-out transistor.

13. The circuit of claim 12, further including insulating regions buried in said single crystal semiconductor layer and located between adjacent fan-out transistor collector regions.

14. The circuit of claim 12, including a plurality of fan-out transistors having a common base layer in said single crystal semiconductor, said common base layer being electrically contacted at a plurality of locations by said polycrystalline layer.

15. The circuit of claim 14, further including insulating regions located in said single crystal semiconductor layer between collector regions of said fan-out transistors.

16. The circuit of claim 12, where said injector transistor is a pnp transistor and said fan-out transistor is a npn transistor.

17. The circuit of claim 12, where said injector transistor is a lateral transistor and said fan-out transistor is a vertical transistor.

18. The circuit of claim 12, further including an electrically insulating layer located between said polycrystalline semiconductor layer and said conductive layer.

19. The circuit of claim 12, where said polycrystalline semiconductor layer is doped to provide electrical conductivity thereof, and said single crystal semiconductor layer has regions therein containing a dopant which has diffused into said single crystal semiconductor layer from said polycrystalline layer.

20. The circuit of claim 12, where said semiconductor layer is selected from the group consisting essentially of Si, Ge, and GaAs.

21. The circuit of claim 12, where said single crystal semiconductor layer is silicon and said polycrystalline semiconductor layer is a layer of doped polysilicon.

22. A MTL circuit comprised of bipolar transistors and including, in combination:

an injector transistor located in a single crystal semiconductor layer and having collector, base, and emitter regions, a plurality of logic fan-out transistors located in said single crystal semiconductor layer, said fan-out transistors having collector, base and emitter regions, said base regions being different portions of a common doped layer of said single crystal semiconductor layer, there being multiple electrical contacts to said common base region by a metal layer, and wherein the collector region of said injector transistor is electrically connected to the base regions of said fan-out transistors, first electrically insulating regions recessed in said single crystal semiconductor layer and abutting the collector regions of said fan-out transistors, second electrically insulating regions recessed in said single crystal semiconductor layer and located between adjacent collector regions of said fan-out transistors, a polycrystalline semiconductor layer making electrical contact to the collector regions of said fan-out transistors and located over said single crystal semiconductor layer, wherein the collector regions of said fan-out transistors are doped from and contacted by said polycrystalline semiconductor layer, the collector-base contact edges of said fan-out transistors being mutually self-aligned, an electrically insulating layer located over said polycrystalline semiconductor layer, a metal layer located over said insulating layer for making electrical contact to the base regions of said fan-out transistors.

23. A MTL circuit comprised of bipolar transistors and including, in combination:

an injector transistor for providing base current to a plurality of logic fan-out bipolar transistors, said injector transistor being located in a single crystal semiconductor layer and having collector, base and emitter regions, a plurality of logic fan-out bipolar transistors located in said single crystal semiconductor layers, having collector, base and emitter regions with electrical contacts thereto, wherein the collector region of said injector transistor is electrically connected to the base regions of said plurality of fan-out transistors via a current-carrying path located over said semiconductor layer, said fan-out transistor base regions being different portions of a common doped region in said single crystal semiconductor layer, there being mutually self-aligned collector-base contact edges of said logic fan-out transistors, first electrically insulating regions recessed in said single crystal semiconductor layer and abutting the collector regions of said fan-out transistors, second electrically insulating regions located in said single crystal semiconductor layer between the collector regions of said fan-out transistors, a polycrystalline semiconductor layer located over said single crystal semiconductor layer for making electrical contact to the base regions of said fan-out transistors and electrically interconnecting said fan-out transistor base regions to said injector transistor, an electrical insulation layer located over said polycrystalline semiconductor layer, a conductive layer located over said electrical insulation layer for providing electrical contact to the collector regions of said fan-out transistors.

24. The circuit of claim 23, wherein said polycrystalline layer is a doped polycrystalline layer and wherein said common doped region includes portions thereof having a dopant diffused from said polycrystalline semiconductor layer.

* * * * *